United States Patent [19]

Genesi

[11] 4,233,618

[45] Nov. 11, 1980

[54] INTEGRATED CIRCUIT WITH POWER TRANSISTOR

[75] Inventor: Robert C. Genesi, Sterling, Mass.

[73] Assignee: Sprague Electric Company, North Adams, Mass.

[21] Appl. No.: 929,759

[22] Filed: Jul. 31, 1978

[51] Int. Cl.³ .................... H01L 29/72; H01L 27/02; H01L 27/04

[52] U.S. Cl. ........................ 357/35; 357/47; 357/48; 357/34; 357/51; 357/68

[58] Field of Search ............ 357/15, 48, 34, 40, 357/47, 67, 35, 36, 51, 68

[56] References Cited

U.S. PATENT DOCUMENTS

| | | | |
|---|---|---|---|
| 3,403,308 | 9/1968 | Schmidt et al. | 357/67 |
| 3,465,214 | 9/1969 | Donald | 357/35 |
| 3,489,964 | 1/1970 | Masuda | 357/35 |
| 3,506,893 | 4/1970 | Dhaka | 357/15 |
| 3,699,362 | 10/1972 | Jordan | 357/15 |
| 3,885,999 | 5/1975 | Fusaroli et al. | 357/48 |
| 3,974,517 | 8/1976 | Sanders et al. | 357/48 |
| 4,001,869 | 1/1977 | Brown | 357/48 |
| 4,017,882 | 4/1977 | Kannam | 357/48 |
| 4,047,220 | 9/1977 | Ferro et al. | 357/48 |
| 4,127,860 | 11/1978 | Beelitz et al. | 357/15 |
| 4,145,621 | 3/1979 | Colaco | 357/48 |

Primary Examiner—Andrew J. James
Attorney, Agent, or Firm—Connolly and Hutz

[57] ABSTRACT

An integrated silicon circuit includes a plurality of high current power transistors. Each of the power transistors is formed in an epitaxial pocket of N-type conductivity being defined by a surrounding P-type isolation wall. A large N-type plug region occupies a central position in the pocket over which lies a large aluminum collector terminal pad. The P-type base region is an elongated strip region essentially surrounding the N-type plug. An elongated emitter lies within the base strip region and is contacted along its entire length by a metal layer that extends broadly in radial directions from the pocket to contact the isolation wall and leading to a ground terminal pad of the entire integrated circuit. The ratio of the current carrying capability of this power transistor to the silicon area occupied by the transistor is high.

12 Claims, 2 Drawing Figures

INTEGRATED CIRCUIT WITH POWER TRANSISTOR

BACKGROUND OF THE INVENTION

This invention relates to a high-current power transistor and more particularly to an integrated circuit that includes a high-current transistor.

The current gain of a bipolar transistor is a function of the current density in the base region, the gain increasing as the current density increases from zero, reaching a maximum and then decreasing as the current density continues to increase. In a typical planar integrated transistor wherein the emitter is usually orders of magnitude more wide at the substrate surface than its depth into the substrate, there is a pronounced tendency for the base current to concentrate at the periphery of the base-emitter junction. Thus the peripheral area of the base-emitter junction predominantly determines the maximum useful current carrying capacity of the transistor. The well known multi-emitter overlay power transistor configuration accounts for this phenomenon and provides a power transistor requiring less silicon substrate real-estate than the single emitter counterpart planar transistor. Another high current planar transistor, also following this rationale, employs a large centrally located emitter region that has a plurality of radially extending fingers that are interdigitated with inwardly extending fingers of the collector region at the substrate surface. The base region has an elongated serpentine area at the substrate surface that is interposed between the emitter and the collector to maximize the peripheral area of the base emitter junction.

It is an object of the present invention to provide a high current power transistor that may be readily incorporated in an integrated circuit and which transistor has a high ratio of rated current to substrate area.

SUMMARY OF THE INVENTION

An integrated semiconductor circuit has a high-current power transistor that is capable of being formed by the same or compatable process steps typically employed for forming a variety of other bipolar devices in other portions of the semiconductor substrate. The semiconductor substrate is of one conductivity type and has grown thereon an epitaxial layer of the opposite conductivity type.

The power transistor has a closed-annular isolation wall region of the one type extending through the epitaxial layer from the outer surface thereof to the interface between the epitaxial layer and the underlying substrate. This wall encloses and defines an epitaxial pocket wherein there is formed an annular strip base region of the one type. The base strip extends from the surface part way through the epitaxial layer. The base strip region is spaced inwardly, preferably a uniform distance from the aforementioned wall. An elongated emitter region of the opposite type is formed within and along the base strip and extends to the surface.

A collector contact plug region of the opposite conductivity type is formed in a central portion of the pocket, is spaced inwardly from the base strip, extends to the surface, and has an electrical conductivity that is substantially greater than that of the immediately adjacent portion of the epitaxial pocket. A metal collector-termination pad overlies and contacts the plug region at the surface. This pad preferably has an area of from $10^4$ to $5 \times 10^4$ square microns, so as to be large enough on the one hand for forming a solder bump there or making a thermocompression wire bond, and on the other hand being small enough to maintain a reasonably high ratio of current carrying capability to the substrate area occupied by the transistor. A metal layer contacts the elongated emitter region substantially along its entire length and may extend outwardly therefrom a substantial distance to provide a low resistance emitter current path. When the emitter is to be connected to circuit ground, then this metal layer may extend from the emitter to contact the surrounding isolation wall. Another metal layer contacts the base strip region essentially along its entire length, and is spaced from and lies between the collector termination pad and the metal layer contacting the emitter.

In comparison with a conventional overlay-type transistor and its associated collector terminal pad, a transistor of this invention exhibiting the same saturation resistance and current gain at 1.0 ampere of collector current, was found to occupy 38% less area on the integrated circuit substrate. Surprisingly and for reasons not fully understood, the overlay-transistor of comparable performance has a total base-emitter peripheral junction area that is substantially greater than that of the transistor of this invention. The geometry of the power transistor of this invention is particularly well suited for the situation wherein a plurality of power transistors are required in the same integrated circuit, each having separate external collector loads. Common connection of all the emitters is readily accomplished by the sharing of one of the aforementioned metal layers which may extend to a single ground termination pad. Broad metal layer contact to the outwardly positioned emitters of each power transistor is possible without cross-overs providing an easily constructed low conductivity emitter connection system. Furthermore, such a broad metal layer may substantially surround each power transistor forming a natural electromagnetic shield that is at or near ground and is interposed between the power transistor and the other circuit portions and devices of the integrated circuit.

DESCRIPTION OF THE PREFERRED EMBODIMENT

Figure 1:
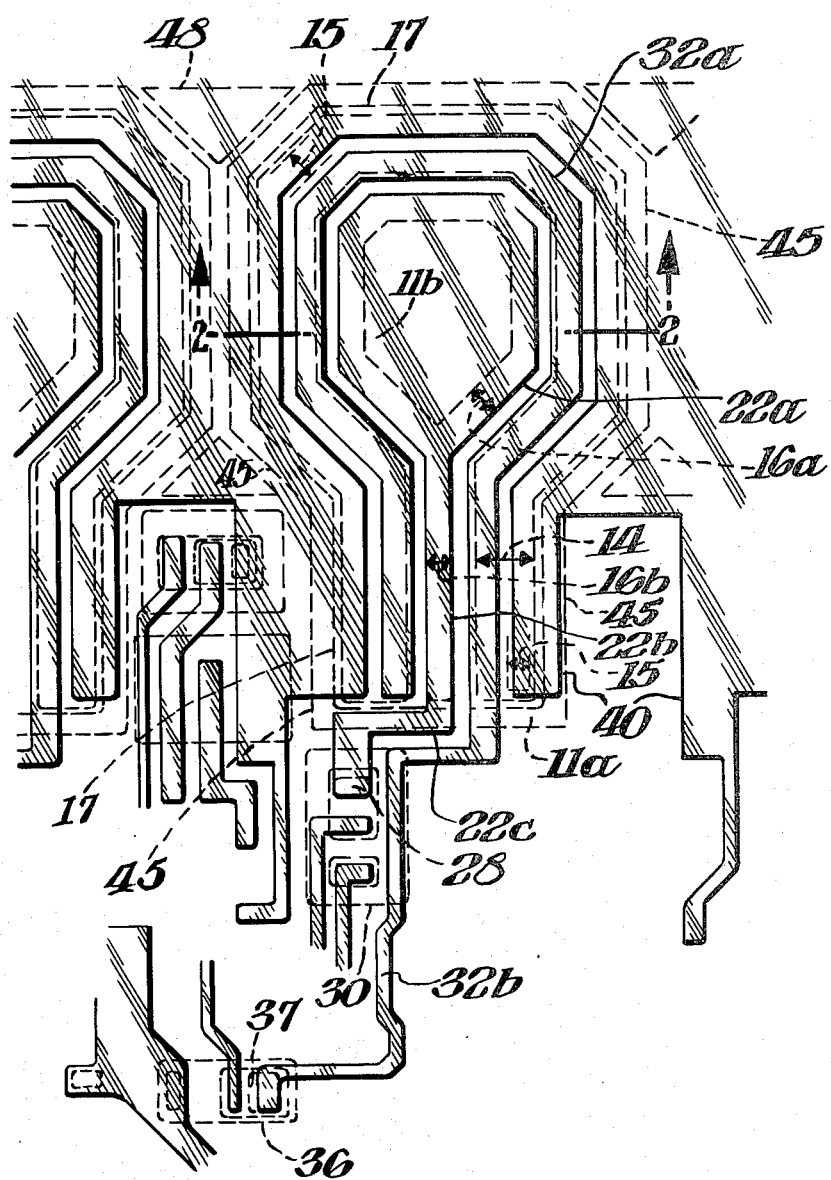
FIG. 1 shows in top view essentially to scale a portion of an integrated circuit of this invention that includes a power transistor. The outlines of the aluminum layers are indicated by solid lines. The location of the interfaces between the differently doped regions within the wafer are indicated by dashed lines.
Figure 2:
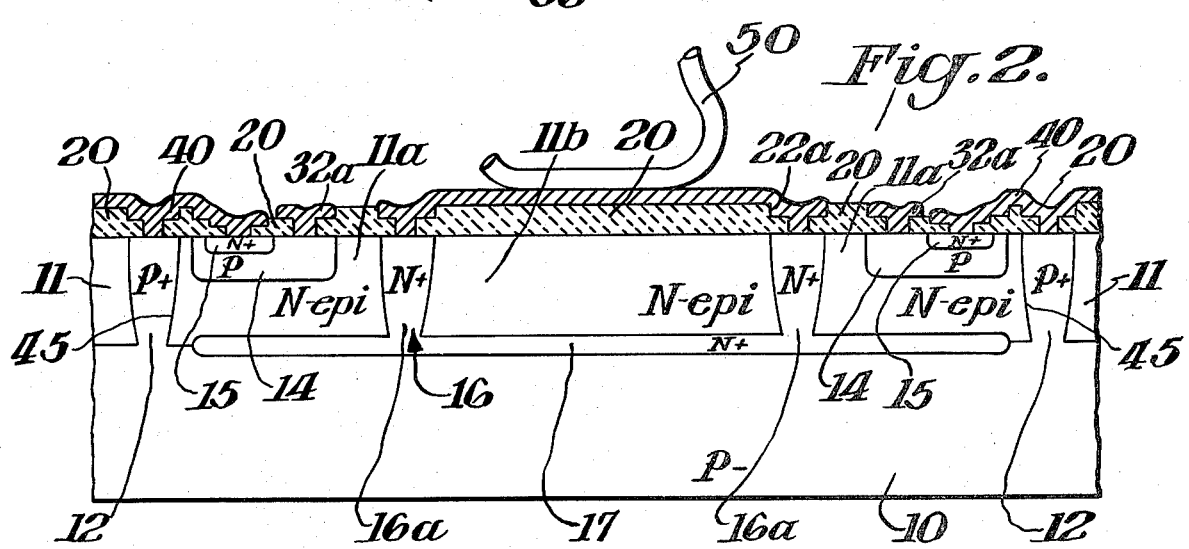
FIG. 2 shows in section 2—2 a magnified portion of the integrated circuit of FIG. 1.

Referring to FIGS. 1 and 2, a crystalline silicon wafer or chip 10 has an epitaxial layer 11 formed over the top surface thereof. Over the outer surface of the epitaxial layer, there is a silicon dioxide film (not shown) which is selectively photo etched to open holes in the film. There are subsequently through these holes diffused P-type impurities to form a closed annular isolation-wall region 12 which extends through the epitaxial layer 11 to the P-type substrate 10. The wall region 12 defines, within the epitaxial layer, a pocket region that includes portions 11a and 11b. The silicon dioxide layer is then removed, and by the similar process steps of growing a new oxide layer (not shown), opening a new pattern of holes therein, and diffusion with P-type impurities, an open annular strip region 14 of P-type is formed in the pocket portion 11a and is spaced an equi-distance inwardly from the wall region 12 along the entire length of the strip 14. Other silicon dioxide diffusion masks are provided through which an elongated region 15 of N-type is formed within and along the strip region 14 and a heavily doped N+ plug region 16 is formed in a central portion of the pocket. A shallow surface region (not shown) of the plug region 16 is then redoped with N-type impurities to insure good ohmic contact with subsequently deposited metal conductors. The plug region 16 is spaced inwardly from the strip region 14 and extends from the surface through the epitaxial layer. The plug region 16 has a finger portion 16b radially extending from a closed annular portion 16a.

In the detail sectional view of FIG. 2, there is shown a portion of an integrated power transistor of FIG. 1, wherein the epitaxial pocket portion 11a serves as the collector region, the strip region 14 serves as the base, and the elongated region 15 serves as the emitter. In order to decrease the resistance of the collector region 11a it is also advantageous to provide a subepitaxial N+ buried layer 17 to improve the collector conductivity. The heavily doped plug regions 16a and 16b contact the buried layer.

The last-used mask is removed from the epitaxial surface, and a permanent silicon dioxide layer 20 is formed over this surface. Holes are provided in the silicon dioxide layer 20 and a layer of aluminum is deposited over the top surface of the wafer. In a subsequent photolithographic and etching step, portions of the aluminum are selectively removed to provide the desired contact at the holes in the silicon dioxide layer 20 between separated portions of the aluminum layers and the doped epitaxial surface.

Thus, a main portion 22a of aluminum layer 22 serves as the collector termination pad, contacting the closed annular plug portion 16a. A narrow extended part 22b of the aluminum layer 22 has an area of contact with the underlying plug finger 16b. The periphery of aluminum layer 22 is substantially coincident with the periphery of the underlying plug region 16. The sub-pocket region 11b that underlies the collector terminal pad 22a is considered to be a portion of plug 16 and may optionally be heavily doped with N-type impurities simultaneously with the doping of the N+ plug 16 that is shown in the Figures.

An extended narrow portion 22c of aluminum layer 22 extends from the outer end of portion 22b away from the pocket 11 over the insulative layer 20 and has a contact with the emitter region 28 of transistor 30.

A separate aluminum layer 32 has a crook portion 32a over the power transistor contacting the base strip region 14 substantially along its entire length. An extended portion 32b of this aluminum layer 32 extends away from the bottle-shaped epitaxial pocket 11 over the silicon dioxide layer 20 to a transistor 36 formed in another portion of the silicon wafer. Aluminum layer 32b contacts the emitter region 37 of transistor 36.

A relatively large area aluminum layer 40 has a long contact area with the elongated emitter region 15 that substantially surrounds the aluminum layers 22a, 22b, 32a. In order to simplify and render more easily readable the drawing of FIG. 1, only representative portions of the emitter region 15 are shown. Pocket 11 has the shape of a long-necked bottle, the two ends of the elongated doped regions 14 and 15 being located near the bottle-mouth portion of the pocket but spaced within the periphery 45 of the pocket. The large aluminum layer 40 makes ohmic contact with triangular isolation wall contact regions, e.g. triangle 48, through triangular holes in the silicon dioxide layer 20. Aluminum layer 40 is the common emitter ground conductor for all five of the transistors. A portion of layer 40 not over active portions of the integrated circuits and having an area of about $2 \times 10^4$ square microns, serves as the integrated circuit ground terminal pad.

The integrated power transistor of this invention is particularly useful in situations wherein the power and current handling capability required can be provided by the transistor having a central plug area and therefore a collector termination pad area of about $2 \times 10^4$ square microns. A smaller termination pad area than about $10^4$ square microns presents too small a target with which to reliably align and attach a lead wire. When the pad area and the area encompassed by the central plug 16a is increased, the areas of the base-emitter junctions and of the base-collector junctions each increase only as the square root of the pad area. This of course leads to an un-needed increase in pad area with a percentagewise smaller increase in current handling capability, and the larger termination pad occupies more precious space on the semiconductor surface than required for attaching a lead wire 50. Thus as the pad area increases, the ratio of the current handling capability of the transistor to the area of the chip occupied by the transistor decreases. Accordingly the area of the collector pad (22a) is preferably less than about $5 \times 10^4$ square microns.

When, up to about 500% more current is required than can be handled by a power transistor of this invention having a preferred collector pad area of about $2 \times 10^4$ square microns, then an extended neck region may be provided to handle the additional current without substantially altering the ratio of current handling capability to the total area occupied by the transistor. Even more than a 500% increase in power handling capability may be provided in this manner but at some point the upper frequency at which the transistor may be an effective amplifier is reduced below that which is required of the particular amplifier circuit under consideration.

When the long-neck feature is not needed, the geometry of the transistor shown in FIG. 1 is modified by eliminating the neck portion of the pocket 11, constructing the isolation wall to close the pocket at a level near the lower (as seen in FIG. 1) edge of the closed annular plug portion 16a. Thus the plug finger region 16b and the base and emitter region portions that are parallel with the finger region 16b would be eliminated also.

Five identical transistors of the type described have been built in a single silicon chip that also contains transistor logic and driving circuitry. FIG. 1 is a scale drawing of a portion of this chip, each power transistor occupying 150,000 square microns of substrate area. FIG. 2 shows a 340 micron wide sectional detail of one of the power transistors. This integrated circuit chip is intended for use in a camera that provides the properly timed high current pulses to fire flash lamps. Each power transistor delivers 1 ampere 2 millisecond wide pulses to a normal lamp and is capable of delivering 1.5 ampere 30 millisecond wide pulses to a shorted lamp every 2 seconds. Each power transistor has a collector terminal pad area (e.g. 22a) of 24,000 square microns and has a base-emitter junction length of 1200 microns (base-emitter periphery of 2400 microns) and a collector-base junction length of 1100 microns. Each transistor has a saturation resistance of about 1 ohm at 1.0 ampere. A standard integrated overlay-type power transistor having 16 emitters and the same 1.0 ohm saturation resistance at one ampere and having about a 20% greater total base-emitter periphery, was built for comparison. The thickness of the diffused emitter regions in both of these transistors is about 1.5 microns, having been developed by essentially the same process steps. The transistor and collector pad of this invention advantageously occupies 38% less silicon surface area than the performance-wise-equivalent overlay transistor plus its $10^4$ square microns collector pad.

What is claimed is:

1. An integrated semiconductor circuit having a high-current power transistor comprising:
    (a) a semiconductor substrate of one conductivity type;
    (b) an epitaxial layer of the opposite conductivity type on said substrate;
    (c) a closed annular isolation-wall region of said one type being formed in said epitaxial layer, said wall region extending through said epitaxial layer from the outer surface thereof to the interface between said epitaxial layer and said substrate, defining within said epitaxial layer a pocket-region;
    (d) an annular strip region of said one type being formed in said pocket region, extending from said surface only part way through said epitaxial layer, and being spaced inwardly from said wall region to serve as the base region of said transistor;
    (e) an elongated region of said opposite type being formed within and along said strip region and extending to said surface to serve as the emitter of said transistor;
    (f) a collector contact plug region of said opposite conductivity type being formed in a central portion of said pocket, being spaced inwardly from said annular strip region, extending from said surface through said epitaxial layer, and having at the periphery thereof a substantially greater electrical conductivity than that of the immediately adjacent portion of said pocket region;
    (g) a metal collector-termination pad overlying and contacting said plug region at said surface, the periphery of said metal pad being substantially coincident with said periphery of said underlying plug region, said collector-termination pad having an area no smaller than $10^4$ square microns;
    (h) one metal layer contacting at said surface said elongated emitter region substantially along the entire length thereof; and
    (i) another metal layer contacting at said surface said base strip region essentially along the entire length thereof, said another layer lying between and being spaced from said collector termination pad and said one metal layer.

2. The integrated circuit of claim 1 wherein said collector-termination pad has an area no greater than $5 \times 10^4$ square microns.

3. The integrated circuit of claim 1 additionally comprising a buried layer of said opposite type at said interface, said layer having an electrical conductivity that is substantially greater than the immediately adjacent portion of said pocket, being in contact with said plug region and being spaced from said wall-region.

4. The integrated circuit of claim 1 wherein said pocket has essentially the shape of a bottle, the annulus of said annular strip region being open and the two ends of said open-annular strip region being located within said pocket near the bottle-mouth portion thereof.

5. The integrated circuit of claim 4 wherein two ends of said elongated emitter region are located within and near said two ends of said open-annular strip base region, respectively.

6. The integrated circuit of claim 4 additionally comprising an auxillary finger-shaped plug region radially extending from said closed annular plug region, said finger region lying centrally within the neck portion of said pocket and being spaced from and lying between the two end portions of said base region.

7. The integrated circuit of claim 6 additionally comprising a narrow metal layer extending from said collector-termination pad over and in contact with said finger region.

8. The integrated circuit of claim 7 wherein said narrow metal layer further extends away from said pocket and contacts another device having been formed in said epitaxial layer.

9. The integrated circuit of claim 4 wherein said second metal layer extends from one of said ends of said base strip region away from said pocket and contacts another device having been formed in said epitaxial layer.

10. The integrated circuit of claim 1 additionally comprising a metal lead wire being attached to said collector termination pad.

11. The integrated circuit of claim 1 wherein said one metal layer extends broadly in radial directions from said pocket.

12. The integrated circuit of claim 11 wherein said broadly extending metal layer contacts said isolation wall region.

* * * * *